(12) United States Patent
Cramer (10) Patent No.: US 10,955,756 B2
(45) Date of Patent: Mar. 23, 2021

(54) METHOD OF MEASURING A TARGET, METROLOGY APPARATUS, LITHOGRAPHIC CELL, AND TARGET

(71) Applicant: ASML NETHERLANDS B.V., Veldhoven (NL)

(72) Inventor: Hugo Augustinus Joseph Cramer, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 190 days.

(21) Appl. No.: 15/970,858

(22) Filed: May 3, 2018

(65) Prior Publication Data
US 2018/0335704 A1 Nov. 22, 2018

(30) Foreign Application Priority Data
May 19, 2017 (EP) .................................. 17171935

(51) Int. Cl.
*G01B 11/26* (2006.01)
*G03F 7/20* (2006.01)
*G03F 9/00* (2006.01)

(52) U.S. Cl.
CPC .......... *G03F 7/70633* (2013.01); *G01B 11/26* (2013.01); *G03F 7/7085* (2013.01); *G03F 7/70616* (2013.01); *G03F 7/70625* (2013.01); *G03F 9/7076* (2013.01); *G03F 9/7084* (2013.01)

(58) Field of Classification Search
CPC .. G03F 7/70633; G03F 7/7085; G03F 9/7084; G01B 11/26
See application file for complete search history.

(56) References Cited

U.S. PATENT DOCUMENTS 7,538,868 B2  5/2009  Shen et al.
9,104,120 B2  8/2015  Seligson et al.
(Continued)

FOREIGN PATENT DOCUMENTS

CN  1963679     5/2007
JP  H05166695   7/1993
(Continued)

OTHER PUBLICATIONS

Japanese Office Action issued in corresponding Japanese Patent Application No. 2019-559019, dated Dec. 10, 2020.

*Primary Examiner* — Maurice C Smith
(74) *Attorney, Agent, or Firm* — Pillsbury Winthrop Shaw Pittman LLP (57) ABSTRACT

Methods and apparatuses for measuring a target formed on a substrate. The target includes an alignment structure and a metrology structure. In one method, a first measurement process is performed that includes illuminating the target with first radiation and detecting radiation resulting from scattering of the first radiation from the target. A second measurement process includes illuminating the target with second radiation and detecting radiation resulting from scattering of the second radiation from the target. The first measurement process detects a position of the alignment structure. The second measurement process uses the position of the alignment structure detected by the first measurement process to align a radiation spot of the second radiation onto a desired location within the metrology structure.

20 Claims, 5 Drawing Sheets

(56) References Cited

U.S. PATENT DOCUMENTS

| | | |
|---|---|---|
| 9,261,772 B2 | 2/2016 | Quintanilha |
| 9,915,879 B2 | 3/2018 | Quintanilha et al. |
| 2003/0227604 A1 | 12/2003 | Best et al. |
| 2006/0065625 A1* | 3/2006 | Abdulhalim ........ G03F 7/70633 216/59 |
| 2011/0249244 A1* | 10/2011 | Leewis .................. G03F 7/706 355/27 |
| 2012/0015461 A1* | 1/2012 | Donaher ................ G03F 7/706 438/16 |
| 2012/0267802 A1 | 10/2012 | De Boer et al. |
| 2015/0153268 A1 | 6/2015 | Amir |
| 2015/0331336 A1 | 11/2015 | Quintanilha et al. |
| 2016/0061589 A1 | 3/2016 | Bhattacharyya et al. |
| 2016/0179017 A1 | 6/2016 | Yohanan et al. |
| 2017/0176871 A1 | 6/2017 | Van Buel et al. |

FOREIGN PATENT DOCUMENTS

| | | |
|---|---|---|
| JP | H08202053 | 8/1996 |
| JP | 2000021769 | 1/2000 |
| JP | 2003273011 | 9/2003 |
| JP | 2004006527 | 1/2004 |
| JP | 2007042966 | 2/2007 |
| JP | 2007096292 | 4/2007 |
| JP | 2017509013 | 3/2017 |
| KR | 1020170013399 | 2/2017 |
| WO | 2009/078708 | 6/2009 |
| WO | 2009/106279 | 9/2009 |

* cited by examiner

METHOD OF MEASURING A TARGET, METROLOGY APPARATUS, LITHOGRAPHIC CELL, AND TARGET

This application claims the benefit of priority of European patent application no. EP17171935, filed May 19, 2017, which is incorporated herein in its entirety by reference.

FIELD

The present description relates to methods and apparatus for measuring a target formed on a substrate, a lithographic cell, and a target.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

It is desirable frequently to make measurements of the structures created by a lithographic process, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Various forms of metrology apparatuses have been developed for use in the lithographic field. These apparatuses direct a beam of radiation onto a target and measure one or more properties of the scattered radiation—e.g., intensity at a single angle of reflection, or over a range of angles of reflection, as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches implemented using rigorous coupled wave analysis or finite element methods; library searches; and principal component analysis. An example of such an apparatus is a scatterometer.

Targets may be measured using, e.g., dark field scatterometry in which the zeroth order of diffraction (corresponding to a specular reflection) is blocked, and only higher orders processed. Examples of metrology can be found in PCT patent application publication nos. WO 2009/078708 and WO 2009/106279, which documents are hereby incorporated by reference in their entirety.

In the context of measuring overlay (undesired misalignment of two patterns in separate layers or in a same layer), intensity asymmetry between different diffraction orders (e.g. between $-1^{st}$ and the $+1^{st}$ diffraction orders) for a given overlay target provides a measurement of target asymmetry; that is, asymmetry in the target. This asymmetry in the overlay target can be used as an indicator of overlay.

SUMMARY

It may be desirable for targets to be positioned in locations where there is little space available for the targets, for example in product areas containing structures of a product being manufactured. Targets positioned in such areas need to be small. It is challenging to align radiation spots with such targets with sufficient accuracy.

It is desirable to improve methods and apparatuses for measuring targets.

According to an aspect, there is provided a method of measuring a target formed on a substrate, the target comprising an alignment structure and a metrology structure, wherein the method comprises:

a first measurement process comprising illuminating the target with first radiation and detecting radiation resulting from scattering of the first radiation from the target; and a second measurement process comprising illuminating the target with second radiation and detecting radiation resulting from scattering of the second radiation from the target, wherein:

the first measurement process detects a position of the alignment structure;

the second measurement process uses the position of the alignment structure detected by the first measurement process to align a radiation spot of the second radiation onto a desired location within the metrology structure; and the radiation spot of the second measurement process is such that:

a smallest quadrilateral boundary box that could notionally surround at least the zeroth order radiation forming the radiation spot intersects with or surrounds the alignment structure; and the at least zeroth order radiation surrounded by the quadrilateral boundary box is exclusively outside of the alignment structure.

According to an aspect, there is provided a metrology apparatus for measuring a target formed on a substrate, the metrology apparatus comprising:

a first measurement system configured to illuminate the target with first radiation and detect radiation resulting from scattering of the first radiation from the target;

a second measurement system configured to illuminate the target with second radiation and detect radiation resulting from scattering of the second radiation from the target; and a controller configured to:

detect a position of the alignment structure using the radiation detected by the first measurement system; and control the second measurement system to use the detected position of the alignment structure to align a radiation spot of the second radiation onto a desired location within the metrology structure, wherein the radiation spot of the second measurement is such that:

a smallest quadrilateral boundary box that could notionally surround at least the zeroth order radiation forming the radiation spot intersects with or surrounds the alignment structure; and the at least zeroth order radiation surrounded by the quadrilateral boundary box is exclusively outside of the alignment structure.

According to an aspect, there is provided a target formed on a substrate, the target comprising:

an alignment structure and a metrology structure, wherein:

an overall reflectance of the metrology structure in respect of illumination by visible light, averaged over the metrology structure, differs from an overall reflectance of the alignment structure in respect of illumination by visible light, averaged over the alignment structure, by at least 20% of the overall reflectance of the alignment structure in respect of illumination by visible light, averaged over the alignment structure;

the metrology structure comprises a circular or oval region in which no portion of the alignment structure is present; and a smallest quadrilateral boundary box that could notionally surround the circular or oval region intersects with or surrounds the alignment structure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

This specification discloses one or more embodiments that incorporate the features of this invention. The disclosed embodiment(s) merely exemplify the invention. The scope of the invention is not limited to the disclosed embodiment (s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing various embodiments in detail, however, it is instructive to present an example environment in which embodiments of the present invention may be implemented.

Figure 1:
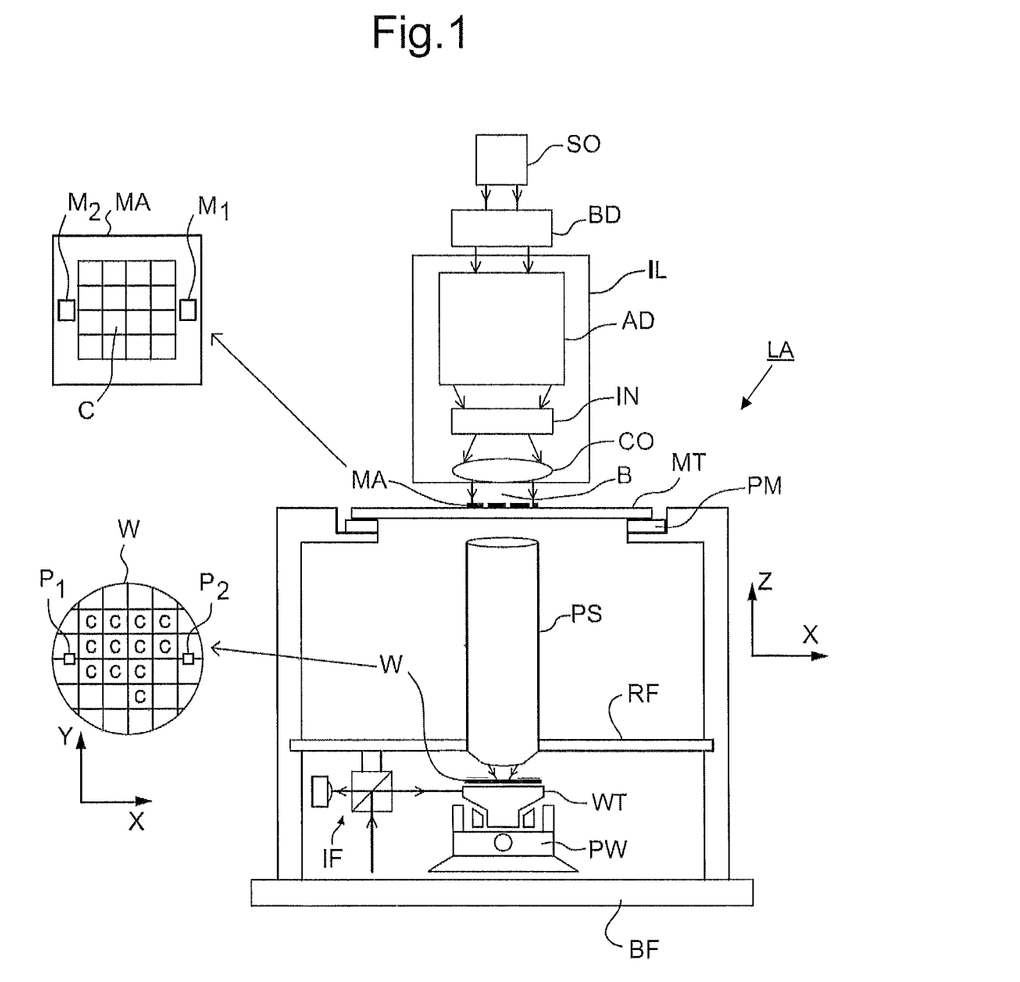
FIG. 1 depicts an embodiment of a lithographic apparatus.

FIG. 1 schematically depicts a lithographic apparatus LA. The apparatus includes an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W, the projection system supported by a frame RF on a base frame BF.

The illumination system may include various types of optical components, such as refractive, reflective, magnetic, electromagnetic, electrostatic, or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing various types of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

In this embodiment, for example, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables and, for example, two or more patterning device tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (which are commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g., after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e., a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
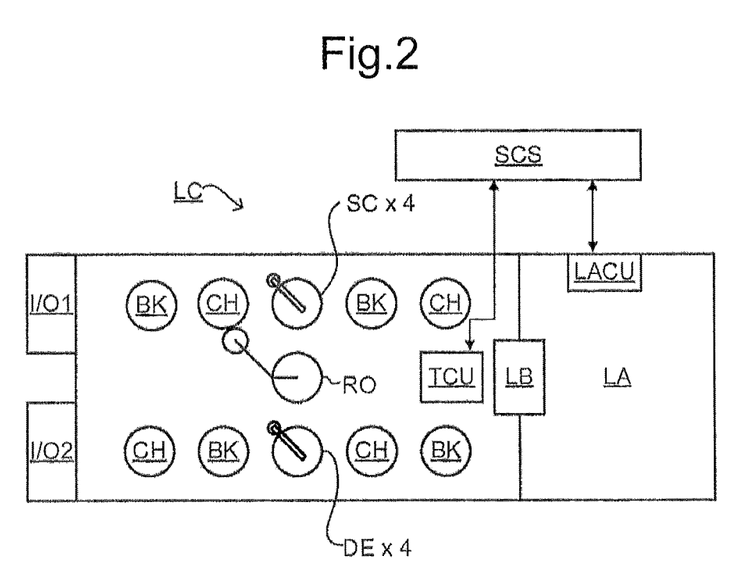
FIG. 2 depicts an embodiment of a lithographic cell or cluster.

As shown in FIG. 2 the lithographic apparatus LA forms part of a lithographic cell LC, also sometimes referred to as a lithocell or cluster, which also includes apparatus to perform pre- and post-exposure processes on a substrate.

Conventionally these include one or more spin coaters SC to deposit resist layers, one or more developers DE to develop exposed resist, one or more chill plates CH and/or one or more bake plates BK. A substrate handler, or robot, RO picks up substrates from input/output ports I/O1, I/O2, moves them between the different process apparatuses and delivers them to the loading bay LB of the lithographic apparatus. These devices, which are often collectively referred to as the track, are under the control of a track control unit TCU that is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure one or more properties such as overlay between subsequent layers, line thicknesses, critical dimensions (CD), etc. If an error is detected, an adjustment, for example, can be made to exposures of subsequent substrates, especially if the inspection can be done soon and fast enough that one or more other substrates of the same batch are still to be exposed. Also, one or more already exposed substrates may be stripped and reworked to improve yield, or possibly be discarded, thereby avoiding performing exposures on a substrate known to be faulty. In a case where only some target portions of a substrate are faulty, further exposures can be performed only on those one or more target portions that are deemed to be non-faulty.

A metrology apparatus is used to determine a property of the substrates, and in particular, how the property of different substrates or different layers of the same substrate vary from layer to layer. The metrology apparatus may be integrated into the lithographic apparatus LA or the lithocell LC or may be a stand-alone device. To enable most rapid measurements, it is desirable that the metrology apparatus measure properties in the exposed resist layer immediately after the exposure. However, the latent image in the resist has a very low contrast, as in there is only a very small difference in refractive index between the parts of the resist which have been exposed to radiation and those which have not—and not all metrology apparatus have sufficient sensitivity to make useful measurements of the latent image. Therefore measurements may be taken after the post-exposure bake step (PEB) that is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step such as etching. The latter possibility limits the possibilities for rework of faulty substrates but may still provide useful information.

Figure 3A:
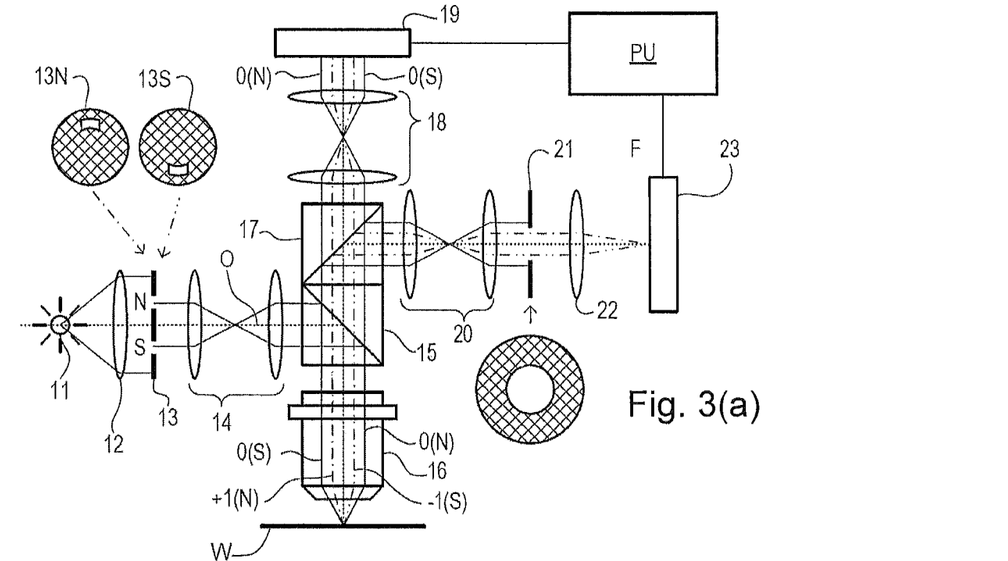
FIG. 3(a) is a schematic diagram of a metrology apparatus for use in measuring targets using a first pair of illumination apertures.

An example metrology apparatus is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by source 11 (e.g., a xenon lamp) is directed onto substrate W via optical element 15 by an optical system comprising lenses 12, 14 and objective 16. These lenses are arranged in a double sequence of a 4F arrangement. A different lens arrangement can be used, provided that it provides, e.g., a substrate image onto a detector and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode will interfere with the desired measurement signals.

Figure 3B:
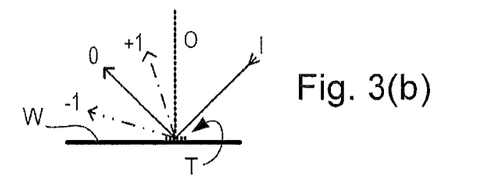
FIG. 3(b) is a schematic detail of diffraction spectrum of a target grating for a given direction of illumination.

As shown in FIG. 3(b), target T is placed with substrate W normal to the optical axis O of objective 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective 16 and directed back through optical element 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective 16. In contrast, when the second illumination mode is applied using aperture plate 13S the −1 diffracted rays (labeled −1(S)) are the ones which enter the objective 16.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed essentially only from the −1 or +1 first order beam (and optionally higher order). The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment, on-axis illumination of the targets is used and an aperture stop with an off-axis aperture is used to pass substantially only one first order of diffracted radiation to the sensor. In yet other embodiments, $2^{nd}$, $3^{rd}$ and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S are used to measure gratings oriented in one direction (X or Y depending on the set-up). For measurement of an orthogonal grating, rotation of the target through 90° and 270° might be implemented. The use of these, and numerous other variations and applications of the apparatus are described in prior published applications, mentioned above.

Figure 3C:
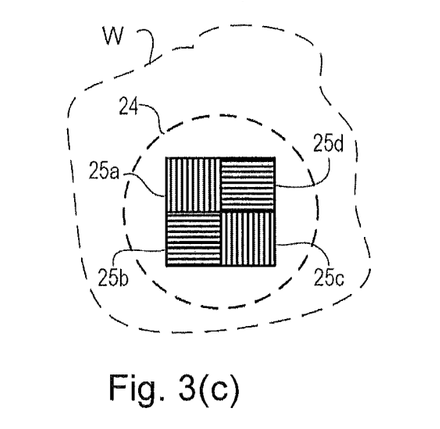
FIG. 3(c) is a schematic depiction of a form of multiple grating target and an outline of a measurement spot on a substrate.

FIG. 3(c) depicts an example of a (composite) target formed on a substrate. The target in this example comprises four gratings 25a to 25d positioned closely together so that they will all be within a measurement scene or measurement spot 24 formed by the metrology radiation illumination beam of the metrology apparatus. The four gratings thus are all simultaneously illuminated and simultaneously imaged on sensors 19 and 23. In an example dedicated to measurement of overlay, gratings 25a to 25d are themselves composite gratings formed by overlying gratings that are patterned in, e.g., different layers of the device formed on substrate W. Gratings 25a to 25d may have differently biased overlay offsets (deliberate mismatch between layers) in order to facilitate measurement of overlay between the layers in which the different parts of the composite gratings are formed. Such techniques are known to the skilled person and will not be described further. Gratings 25a to 25d may also differ in their orientation, as shown, so as to diffract incoming radiation in X and Y directions. In one example, gratings 25a and 25c are X-direction gratings with biases of the +d, −d, respectively. Gratings 25b and 25d are Y-direction gratings with offsets +d and −d respectively. Separate images of these gratings can be identified in the image captured by sensor 23. This is only one example of a target. A target may comprise more or fewer than four gratings, or only a single grating.

Figure 3D:
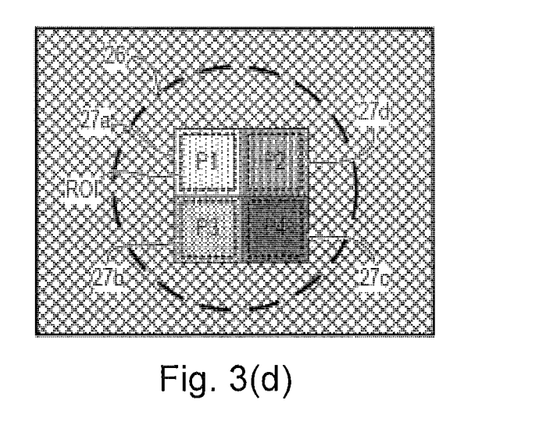
FIG. 3(d) is a schematic depiction of an image of the target of FIG. 3(c) obtained in the metrology apparatus of FIG. 3(a)

FIG. 3(d) shows an example of an image that may be formed on and detected by the sensor 23, using the target of FIG. 3(c) in the apparatus of FIG. 3(a). While the pupil plane image sensor 19 cannot resolve the different individual gratings 25a to 25d, the image sensor 23 can do so. The dark rectangle represents the field of the image on the sensor, within which the illuminated spot 24 on the substrate is imaged into a corresponding circular area 26. Within this, rectangular areas 27a to 27d represent the images of the small target gratings 25a to 25d. If the targets are located in product areas, product features may also be visible in the periphery of this image field. Image processor and control system PU processes these images using pattern recognition to identify the separate images 27a to 27d of gratings 25a to 25d. In this way, the images do not have to be aligned very precisely at a specific location within the sensor frame, which greatly improves throughput of the measuring apparatus as a whole.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 4:
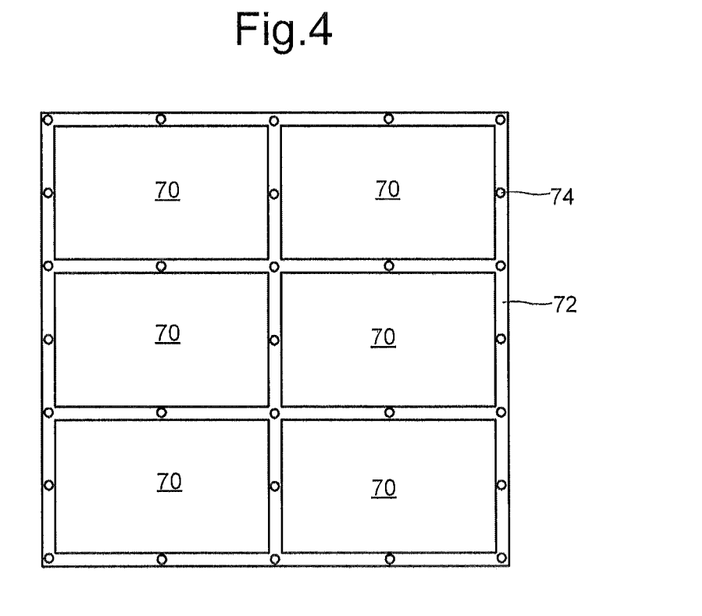
FIG. 4 schematically depicts an embodiment of targets positioned in a scribe lane outside of product areas.

FIG. 4 depicts example targets 74 (depicted as circular features) positioned in scribe lanes 72 surrounding product areas 70. Positioning targets 74 in scribe lanes 72 is convenient because the scribe lanes allow targets 74 to be relatively large. Furthermore, regions around targets 74 in the scribe lane 72 can be arranged to have a relatively large optical contrast with respect to the targets 74. A large optical contrast makes it easier to align radiation spots with the targets 74. In one approach an image of a region containing the target 74 is obtained. Computer-implemented pattern recognition uses the image to identify where the target 74 is located. The location is used to align a radiation spot with the target 74 during a subsequent measurement process using the target 74.

Where it is desired to perform metrology measurements at a higher spatial density over the substrate W, it may be necessary to position targets 74 at locations other than in the scribe lanes 72. This may be necessary for example where higher order corrections are to be implemented using measurements of the targets 74. It may be necessary for example to position targets within the product areas 70. At locations other than in the scribe lanes 72, it may be difficult to arrange for an optical contrast to be sufficiently high in the region surrounding a target 74 for the target 74 to be identified reliably using computer-implemented pattern recognition. Additional high contrast structures could be formed adjacent to the targets 74 but this would use up additional space, which may not be available. Radiation spots could be aligned with the targets 74 without having to recognize each target 74, or recognize an alignment structure associated with each target 74. This could be achieved using other alignment structures and relying on the accuracy of movement of the substrate table WT. It is difficult, however, to achieve high accuracy using this approach. Furthermore, the space available for individual targets 74 at locations other than in the scribe lanes 72 may require targets 74 to be very small. Targets 74 may be smaller than 100 (e.g., 10×10) $\mu m^2$, optionally about 25 (e.g., 5×5) $\mu m^2$, for example. This increases the difficulty of aligning radiation spots with targets 74 sufficiently accurately.

Figure 5:
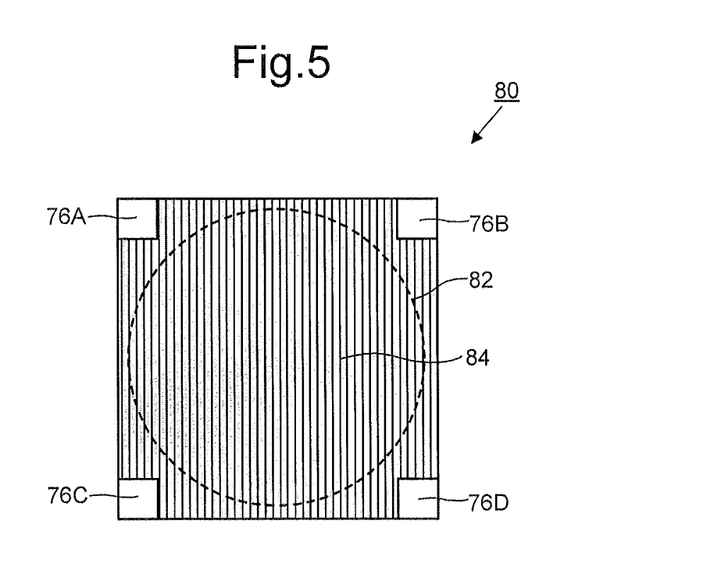
FIG. 5 schematically depicts an embodiment of a circular radiation spot on a target comprising an alignment structure and a metrology structure.
Figure 6:
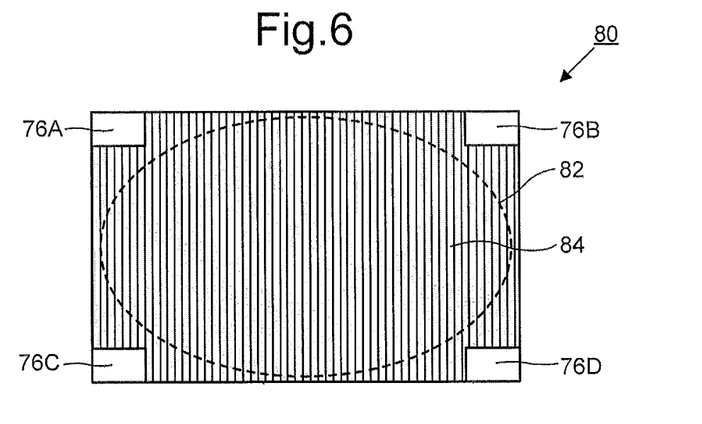
FIG. 6 schematically depicts an embodiment of an oval radiation spot on a target comprising an alignment structure and a metrology structure.

Methods according to embodiments of the present disclosure address one or more of the above or other challenges. The methods comprise measuring a target 80 formed on a substrate W. Example targets 80 are depicted in FIGS. 5 and 6. The target 80 comprises one or more alignment structures 76A-D. In an embodiment, the target 80 comprises two or more alignment structures 76A-D separated from each other. In the examples of FIGS. 5 and 6, four alignment structures 76A-D separated from each other are provided. The target 80 further comprises a metrology structure 84.

A first measurement process is performed that comprises illuminating the target 80 with first radiation and detecting radiation resulting from scattering of the first radiation from the target 80. A second measurement process is performed that comprising illuminating the target 80 with second radiation and detecting radiation resulting from scattering of the second radiation from the target 80.

The first measurement process detects a position of each of one or more of the alignment structures 76A-D. In an embodiment, the detection comprises forming an image of each of one or more of the alignment structures 76A-D and the metrology structure 84. Computer-implemented pattern recognition may then be used to recognize the alignment structure 76A-D and thereby detect the position. The detection may be facilitated by arranging for each of one or more of the alignment structures 76A-D to have a high optical contrast with respect to surrounding areas on the substrate W such as the metrology structure 84. In an embodiment, an overall reflectance of the metrology structure 84 in respect of illumination by the first radiation, averaged over the metrology structure 84, differs from an overall reflectance of each of one or more of the alignment structures 76A-D in respect of illumination by the first radiation, averaged over the alignment structure 76A-D, by at least 20%, optionally at least 50%, optionally at least 80%, optionally at least 90%, of the overall reflectance of the alignment structure 76A-D in respect of illumination by the first radiation, averaged over the alignment structure 76A-D. In an embodiment, at least the first radiation comprises visible radiation, such that the overall reflectance of the metrology structure 84 in respect of illumination by visible radiation, averaged over the metrology structure 84, differs from an overall reflectance of each of one or more of the alignment structures 76A-D in respect of illumination by visible radiation, averaged over the alignment structure 76A-D, by at least 20%, optionally at least 50%, optionally at least 80%, optionally at least 90%, of the overall reflectance of the alignment structure 76A-D in respect of illumination by visible radiation, averaged over the alignment structure 76A-D.

The metrology structure 84 may comprise any structure suitable for performing a metrology measurement. The metrology measurement may measure a parameter of a lithographic process or of a step in a manufacturing sequence that includes at least one lithographic step. The parameter may comprise overlay or critical dimension for example. In various embodiments, the metrology structure 84 comprises a periodic structure such as a grating. The metrology structure 84 may comprise any of the structures of the metrology target T described above with reference to FIG. 3(*a*)-(*d*). In an embodiment, each of one or more of the alignment structures 76A-D is non-periodic.

The second measurement process uses the position of each of one or more of the alignment structures 76A-D detected by the first measurement process to align a radiation spot 82 of the second radiation onto a desired location within the metrology structure 84 (e.g. in the center of the metrology structure 84). The radiation spot 82 of the second measurement process is such that a smallest quadrilateral boundary box that could notionally surround at least the zeroth order radiation forming the radiation spot 82 intersects with or surrounds each of one or more of the alignment structures 76A-D. In an embodiment, the shape of the radiation spot 82 is defined by diffraction effects to be circular or oval (depending on the angle of incidence onto the substrate W). Higher than zeroth order lobes may be present or may be removed by optical filtering (apodization). The at least zeroth order radiation surrounded by the quadrilateral boundary box is exclusively outside of each of one or more of the alignment structures 76A-D. Thus, a target 80 is provided in which the metrology structure 84 comprises a circular or oval region (i.e. the region defining the at least zeroth order radiation forming the radiation spot 82) in which no alignment structure is present, and the smallest quadrilateral boundary box that could notionally surround the circular or oval region intersects with or surrounds each of one or more alignment structures 76A-D.

In an embodiment, two or more alignment structures are provided and each of the alignment structures overlaps with a respective corner of the smallest quadrilateral boundary box. Examples of this type are depicted in FIGS. 5 and 6.

In the example of FIG. 5, a radiation spot 82 formed from zeroth order radiation is circular. This may be achieved for example by radiation perpendicularly incident on the substrate W. Four alignment structures 76A-D are provided outside of the radiation spot 82. The smallest quadrilateral boundary box that could surround the radiation spot 82 is a square dimensioned such that each side of the square touches a portion of the circle defining the radiation spot 82. The square would intersect each of the four alignment structures 76A-D.

In the example of FIG. 6, a radiation spot 82 formed from zeroth order radiation is oval. This may be achieved for example by radiation with a circularly symmetric cross-sectional profile being incident obliquely onto the substrate W. Four alignment structures 76A-D are provided outside of the radiation spot 82. The smallest quadrilateral boundary box that could surround the radiation spot 82 is a rectangle dimensioned such that each side of the rectangle touches a portion of the oval defining the radiation spot. The rectangle would intersect each of the four alignment structures 76A-D.

In embodiments where the smallest quadrilateral boundary box is square or rectangular, either or both of the width and the height of the boundary box may be less than or equal to 10 microns, optionally less than or equal to 9 microns, optionally less than or equal to 8 microns, optionally less than or equal to 7 microns, optionally less than or equal to 6 microns, or optionally less than or equal to 5 microns.

Embodiments are based on the recognition that the radiation spot 82 used for measurement will typically be circular or oval, particularly for small targets, whereas the region available for positioning the target 82 will typically have a quadrilateral form (e.g. square or rectangular). This leaves room for positioning alignment structures without increasing the overall area used by the target 80. For a 5×5 μm² target, for example, the region between a maximal radiation spot 82 and the smallest square boundary box would provide room for four alignment structures of 750 nm×750 nm each.

Figure 7:
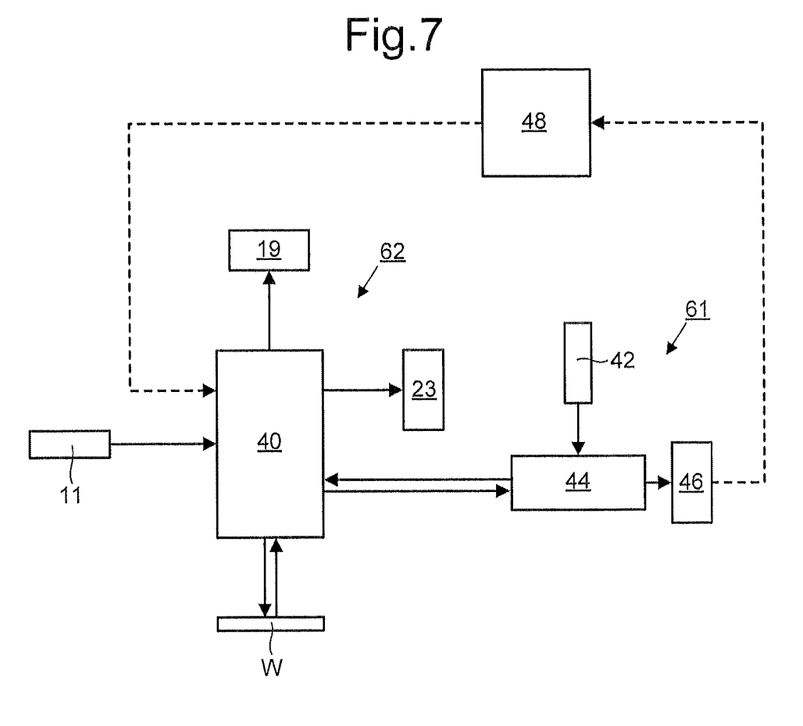
FIG. 7 schematically depicts an embodiment of a metrology apparatus comprising a first measurement system, a second measurement system, and a control system.

FIG. 7 depicts an example metrology apparatus based on the above principles. The metrology apparatus comprises a first measurement system 61 and a second measurement system 62. The metrology apparatus may be provided as part of a lithographic apparatus or lithocell, for example as described above with reference to FIGS. 1 and 2. The metrology apparatus is configured to measure a target 80 formed on a substrate W according to any of the methods described above.

The first measurement system 61 performs the first measurement process described above. In an embodiment, the first measurement system 61 comprises a first radiation source 42. The first radiation source 42 illuminates the target 80 with the first radiation via an optical system 44.

The second measurement system 62 performs the second measurement process described above. In an embodiment, the second measurement system 62 comprises a second radiation source 11. The second radiation source 11 illuminates the target with the second radiation. In an embodiment, the first radiation source 42 is different from the second radiation source 11, for example configured to output radiation having different properties and/or housed in a separate device. The radiation from the first radiation source 42 is configured to be suitable for performing the first measurement process. The radiation from the second radiation source 11 is configured to be suitable for performing the second measurement process.

The second measurement system 62 comprises an optical system 40 for directing radiation from the first radiation source 11 onto the substrate W. Redirected radiation from the substrate W is directed by the optical system 40 onto one or more sensors 19,23. In an embodiment, the second measurement system 62 comprises a metrology apparatus of the type described above with reference to FIG. 3(a). In embodiments of this type the optical system 40 may comprise lenses 12 and 14 and an objective 16, as depicted in FIG. 3(a). The optical system 40 may further comprise an optical element 15 for directing the radiation towards the substrate W, as depicted in FIG. 3(a). The optical system 40 may further comprise either or both of the first measurement branch and the second measurement branch. In the particular example of FIG. 7, both of these measurement branches are provided. Example details of the optical elements of each of the measurement branches are depicted in FIG. 3(a). An output from the first measurement branch is directed to the sensor 19. An output from the second measurement branch is directed to the sensor 23.

In an embodiment, the optical system 40 comprises a beam splitter as part of the objective 16 (see FIG. 3(a)) to direct radiation from the first radiation source 42 from the optical system 44 to the substrate W and back from the substrate W to the optical system 44. The first measurement process uses an output from a sensor 46.

In an embodiment, a control system or controller 48 is provided that detects the position of one or more alignment structures 76A-D using the output from sensor 46. The control system 48 controls the second measurement process, performed by the second measurement system 62, using the detected position of the one or more alignment structures 76A-D to align a radiation spot of the second radiation onto a desired location on or within the metrology structure 84.

The concepts disclosed herein may find utility beyond post-lithography measurement of structures for monitoring purposes. For example, such a detector architecture may be used in future alignment sensor concepts, that are, e.g., based on pupil plane detection, used in lithographic apparatuses for aligning the substrate during the patterning process.

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' as used herein do not require that the structure has been provided specifically for the measurement being performed.

The metrology apparatus can be used in a lithographic system, such as the lithographic cell LC discussed above with reference to FIG. 2. The lithographic system comprises a lithographic apparatus LA that performs a lithographic process. The lithographic apparatus may be configured to use the result of a measurement by the metrology apparatus of a structure formed by the lithographic process when performing a subsequently lithographic process, for example to improve the subsequent lithographic process.

An embodiment may include a computer program containing one or more sequences of machine-readable instructions describing methods of measuring targets on a structures and/or analyzing measurements to obtain information about a lithographic process. There may also be provided a data storage medium (e.g., semiconductor memory, magnetic or optical disk) having such a computer program stored therein. Where an existing lithography or metrology apparatus is already in production and/or in use, an embodiment of the invention can be implemented by the provision of updated computer program products for causing a processor to perform the methods described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Further embodiments according to the present invention are described in below numbered clauses:

1. A method of measuring a target formed on a substrate, wherein the target comprises an alignment structure and a metrology structure, the method comprising:
   a first measurement process comprising illuminating the target with first radiation and detecting radiation resulting from scattering of the first radiation from the target; and
   a second measurement process comprising illuminating the target with second radiation and detecting radiation resulting from scattering of the second radiation from the target, wherein:
   the first measurement process detects a position of the alignment structure;
   the second measurement process uses the position of the alignment structure detected by the first measurement process to align a radiation spot of the second radiation onto a desired location within the metrology structure; and
   the radiation spot of the second measurement process is such that:
      a smallest quadrilateral boundary box that could notionally surround at least the zeroth order radiation forming the radiation spot intersects with or surrounds the alignment structure; and the at least zeroth order radiation surrounded by the quadrilateral boundary box is exclusively outside of the alignment structure.
2. The method of clause 1, wherein the first measurement process comprises forming an image of the alignment structure and the metrology structure.
3. The method of clause 2, wherein the first measurement process uses computer-implemented pattern recognition to recognize the alignment structure.
4. The method of any preceding clause, wherein the metrology structure comprises a periodic structure.
5. The method of any preceding clause, wherein the alignment structure is non-periodic.
6. The method of any preceding clause, wherein an overall reflectance of the metrology structure in respect of illumination by the first radiation, averaged over the metrology structure, differs from an overall reflectance of the alignment structure in respect of illumination by the first radiation, averaged over the alignment structure, by at least 20% of the overall reflectance of the alignment structure in respect of illumination by the first radiation, averaged over the alignment structure.
7. The method of any preceding clause, wherein the target comprises two or more alignment structures separated from each other.
8. The method of any preceding clause, wherein the smallest quadrilateral bounding box is square or rectangular.
9. The method of any preceding clause, wherein the radiation spot is circular or oval.
10. The method of any preceding clause, wherein the radiation spot is diffraction limited to be circular or oval.
11. A metrology apparatus for measuring a target formed on a substrate, comprising:
a first measurement system configured to illuminate the target with first radiation and detect radiation resulting from scattering of the first radiation from the target;
a second measurement system configured to illuminate the target with second radiation and detect radiation resulting from scattering of the second radiation from the target; and
a controller configured to:
detect a position of the alignment structure using the radiation detected by the first measurement system; and
control the second measurement system to use the detected position of the alignment structure to align a radiation spot of the second radiation onto a desired location within the metrology structure,
wherein the radiation spot of the second measurement is such that:
a smallest quadrilateral boundary box that could notionally surround at least the zeroth order radiation forming the radiation spot intersects with or surrounds the alignment structure; and
the at least zeroth order radiation surrounded by the quadrilateral boundary box is exclusively outside of the alignment structure.
12. The apparatus of clause 11, wherein the first measurement system is configured to form an image of the alignment structure and the metrology structure.
13. The apparatus of clause 12, wherein the controller uses computer-implemented pattern recognition to recognize the alignment structure.
14. The apparatus of any of clauses 11-13, wherein the metrology structure comprises a periodic structure.
15. The apparatus of any of clauses 11-14, wherein the alignment structure is non-periodic.
16. The apparatus of any of clauses 11-15, wherein an overall reflectance of the metrology structure in respect of illumination by the first radiation, averaged over the metrology structure, differs from an overall reflectance of the alignment structure in respect of illumination by the first radiation, averaged over the alignment structure, by at least 20% of the overall reflectance of the of the alignment structure in respect of illumination by the first radiation, averaged over the alignment structure.
17. The apparatus of any of clauses 11-16, wherein the target comprises two or more alignment structures separated from each other.
18. The apparatus of any of clauses 11-17, wherein the smallest quadrilateral bounding box is square or rectangular.
19. The apparatus of any of clauses 11-18, wherein the radiation spot is circular or oval.
20. The apparatus of any of clauses 11-19, wherein the radiation spot is diffraction limited to be circular or oval.
21. A lithographic cell comprising:
a lithographic apparatus configured to perform a lithographic process to define a target on a substrate; and
the metrology apparatus of any of clauses 11-20 configured to measure the target.
22. A target formed on a substrate, the target comprising:
an alignment structure and a metrology structure, wherein:
an overall reflectance of the metrology structure in respect of illumination by visible light, averaged over the metrology structure, differs from an overall reflectance of the alignment structure in respect of illumination by visible light, averaged over the alignment structure, by at least 20% of the overall reflectance of the alignment structure in respect of illumination by visible light, averaged over the alignment structure;
the metrology structure comprises a circular or oval region in which no portion of the alignment structure is present; and
a smallest quadrilateral boundary box that could notionally surround the circular or oval region intersects with or surrounds the alignment structure.
23. The target of clause 22, wherein the smallest quadrilateral boundary box is square or rectangular.
24. The target of clause 23, wherein either or both of the width and the height of the smallest quadrilateral boundary box is or are less than 10 microns.
25. The target of any of clauses 22-24, wherein the metrology structure comprises a periodic structure.
26. The target of any of clauses 22-25, wherein the alignment structure is non-periodic.
27. The target of any of clauses 22-26, wherein the target comprises two or more alignment structures separated from each other.
28. The target of clause 27, wherein each of the alignment structures overlaps with a respective corner of the smallest quadrilateral boundary box.
29. A method of measuring the target of any of clauses 22-28, wherein the method comprises:
a first measurement process comprising illuminating the target with first radiation and detecting radiation resulting from scattering of the first radiation from the target; and
a second measurement process comprising illuminating the target with second radiation and detecting radiation resulting from scattering of the second radiation from the target, wherein:
the first measurement process detects a position of the alignment structure; and the second measurement process uses the position of the alignment structure detected by the first measurement process to align a radiation spot of the second radiation onto a desired location within the metrology structure.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength, of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic, and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a target formed on a substrate, the method comprising:
   a first measurement process comprising illuminating a target with first radiation and detecting radiation resulting from scattering of the first radiation from the target; and
   a second measurement process comprising illuminating the target with second radiation and detecting radiation resulting from scattering of the second radiation from the target, wherein:
   the first measurement process detects a position of an alignment structure of the target;
   the second measurement process uses the position of the alignment structure detected by the first measurement process to align a radiation spot of the second radiation onto a desired location within a metrology structure of the target; and
   the radiation spot of the second measurement process is such that:
      a smallest abstract quadrilateral boundary box on the target that surrounds collectively at least the zeroth order radiation forming the radiation spot intersects with or surrounds the alignment structure; and
      the at least zeroth order radiation surrounded by the quadrilateral boundary box is exclusively outside of the alignment structure.

2. The method of claim 1, wherein the first measurement process comprises forming an image of the alignment structure and the metrology structure.

3. The method of claim 2, wherein the first measurement process uses computer-implemented pattern recognition to recognize the alignment structure.

4. The method of claim 1, wherein the metrology structure comprises a periodic structure.

5. The method of claim 1, wherein the alignment structure is non-periodic.

6. The method of claim 1, wherein an overall reflectance of the metrology structure in respect of illumination by the first radiation, averaged over the metrology structure, differs from an overall reflectance of the alignment structure in respect of illumination by the first radiation, averaged over the alignment structure, by at least 20% of the overall reflectance of the alignment structure in respect of illumination by the first radiation, averaged over the alignment structure.

7. The method of claim 1, wherein the target comprises two or more alignment structures separated from each other.

8. The method of claim 1, wherein the smallest quadrilateral bounding box is square or rectangular.

9. The method of claim 1, wherein the radiation spot is circular or oval.

10. The method of claim 1, wherein the radiation spot is diffraction limited to be circular or oval.

11. A metrology apparatus for measuring a target formed on a substrate, the metrology apparatus comprising:
   first optics configured to provide first radiation toward the target and a first detector configured to detect radiation resulting from scattering of the first radiation from the target;
   second optics configured to provide second radiation toward the target and a second detector configured to detect radiation resulting from scattering of the second radiation from the target; and
   a controller or a non-transitory computer-readable medium having instructions therein, the controller configured or the instructions, upon execution by a computer system, configured to cause the computer system, to:
      cause detection or determination of a position of an alignment structure of the target using the radiation detected by the first detector; and
      use the detected position of the alignment structure to cause alignment of a radiation spot of the second radiation onto a desired location within a metrology structure of the target such that when the radiation spot is incident on the metrology structure:
         radiation of the radiation spot is located relative to the alignment structure such that a smallest abstract quadrilateral boundary box on the target that surrounds collectively at least the zeroth order radiation forming the radiation spot intersects with or surrounds the alignment structure; and
         the at least zeroth order radiation surrounded by the quadrilateral boundary box is exclusively outside of the alignment structure.

12. The apparatus of claim 11, wherein optics are configured to form an image of the alignment structure and the metrology structure.

13. The apparatus of claim 12, wherein the control system uses computer-implemented pattern recognition to recognize the alignment structure.

14. A lithographic cell comprising:
a lithographic apparatus configured to perform a lithographic process to define a target on a substrate; and
the metrology apparatus of claim 11 configured to measure the target.

15. A target formed on a substrate, the target comprising:
an alignment structure and a metrology structure, wherein:
an overall reflectance of the metrology structure in respect of illumination by visible light, averaged over the metrology structure, differs from an overall reflectance of the alignment structure in respect of illumination by visible light, averaged over the alignment structure, by at least 20% of the overall reflectance of the alignment structure in respect of illumination by visible light, averaged over the alignment structure;
the metrology structure comprises an area in which no portion of the alignment structure is present; and
when the radiation spot is incident on the metrology structure, radiation of the radiation spot is located relative to the alignment structure such that a smallest abstract quadrilateral boundary box on the target that surrounds the area intersects with or surrounds the alignment structure.

16. The target of claim 15, wherein the smallest quadrilateral boundary box is square or rectangular.

17. The target of claim 16, wherein i) the width of the smallest quadrilateral boundary box is less than 10 microns, or ii) the height of the smallest quadrilateral boundary box is less than 10 microns, or iii) both i) and ii).

18. The target of claim 15, wherein the metrology structure comprises a periodic structure.

19. The target of claim 15, wherein the alignment structure is non-periodic.

20. A method of measuring the target of claim 15, wherein the method comprises:
a first measurement process comprising illuminating the target with first radiation and detecting radiation resulting from scattering of the first radiation from the target; and
a second measurement process comprising illuminating the target with second radiation and detecting radiation resulting from scattering of the second radiation from the target, wherein:
the first measurement process detects a position of the alignment structure; and
the second measurement process uses the position of the alignment structure detected by the first measurement process to align a radiation spot of the second radiation onto a desired location within the metrology structure.

* * * * *